(12) United States Patent
Yamamoto et al.

(10) Patent No.: US 11,322,218 B2
(45) Date of Patent: May 3, 2022

(54) ERROR CONTROL FOR MEMORY DEVICE

(71) Applicant: Micron Technology, Inc., Boise, ID (US)

(72) Inventors: Nobuo Yamamoto, Nerima (JP); Donald Martin Morgan, Meridian, ID (US); Victor Wong, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/895,960

(22) Filed: Jun. 8, 2020

(65) Prior Publication Data

US 2021/0383888 A1    Dec. 9, 2021

(51) Int. Cl.
| | | |
|---|---|---|
| *G11C 29/00* | (2006.01) | |
| *G11C 29/42* | (2006.01) | |
| *G11C 29/44* | (2006.01) | |
| *G11C 16/10* | (2006.01) | |
| *G11C 16/26* | (2006.01) | |
| *G11C 29/20* | (2006.01) | |

(52) U.S. Cl.
CPC ............ *G11C 29/42* (2013.01); *G11C 16/10* (2013.01); *G11C 16/26* (2013.01); *G11C 29/20* (2013.01); *G11C 29/44* (2013.01)

(58) Field of Classification Search
CPC .......... G11C 29/44; G11C 16/10; G11C 29/42
See application file for complete search history.

(56) References Cited

U.S. PATENT DOCUMENTS

| 8,924,832 | B1* | 12/2014 | Lam | G06F 11/1016 |
| | | | | 714/799 |
| 10,127,101 | B2* | 11/2018 | Halbert | G06F 11/1068 |
| 10,210,041 | B2* | 2/2019 | Zhang | G06F 3/0647 |
| 2007/0022244 | A1* | 1/2007 | Kimmery | G06F 11/106 |
| | | | | 711/106 |
| 2015/0220395 | A1 | 8/2015 | Bueb et al. | |
| 2016/0321135 | A1 | 11/2016 | Berman et al. | |

(Continued)

OTHER PUBLICATIONS

ISA/KR, International Search Report and Written Opinion of the International Searching Authority, Int'l Appl. No. PCT/US2021/033457, dated Sep. 9, 2021, Korean Intellectual Property Office, Seo-gu, Daejeon, Republic of Korea, 10 pgs.

*Primary Examiner* — Uyen Smet

(74) *Attorney, Agent, or Firm* — Holland & Hart LLP

(57) ABSTRACT

Methods, systems, and devices for error control for memory device are described. A memory device may be configured to perform memory management operations including error control operations. For example, a memory device may be configured to perform an error control operation on data stored in a first memory cell coupled with a source row of a memory array. The memory device may be configured to write the data to a second memory cell coupled with the target row of the memory array based on performing the error control operation on the data and determine whether the management operation is complete based at least in part on the first column address of the first memory cell. The memory device may also generate an output signal to perform the error control operation on a third memory cell coupled with the source row based on determining whether the management operation is complete.

26 Claims, 9 Drawing Sheets

(56) References Cited

U.S. PATENT DOCUMENTS

2019/0108089 A1  4/2019 Kim
2019/0324854 A1  10/2019 Park et al.
2020/0050513 A1  2/2020 Kim et al.

* cited by examiner

ERROR CONTROL FOR MEMORY DEVICE

BACKGROUND

The following relates generally to one or more memory systems and more specifically to error control for memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Some memory devices may use one or more memory management operations to manage the data stored in the memory device. For example, a memory device may use wear-leveling, row-copy operations, or other types of operations, to distribute wear and/or extend the functional life of the memory device. Some of these operations may not include error control aspects, which may cause errors to propagate and/or new errors to be introduced into the data during the memory management operation. Some of these operations may be configured to transfer data within a same section of a memory device, which may limit possibilities for wear-leveling and other distributions of data.

Systems, devices, and techniques are described for using error control operations in a memory management operation. In some cases, a memory management operation, such as a row-copy operation, may be configured to include an error control operation. A column address counter may be used to track whether each memory cell of the memory source row has had error control applied and has been stored in the target row. In some cases, a memory management operation, such as a sense-copy operation, may be configured to transfer data between different sections of a memory device. An error correction component may be configured to toggle between a source section and a target section to facilitate the transfer and error control of the information being transferred.

Features of the disclosure are initially described in the context of memory systems and dies as described with reference to FIGS. 1-2. Features of the disclosure are described in the context of memory device circuitry and timing diagrams as described with reference to FIGS. 3 through 6. These and other features of the disclosure are further illustrated by and described with reference to an apparatus diagram and flowcharts that relate to error control for memory device as described with reference to FIGS. 7 through 9.

Figure 1:
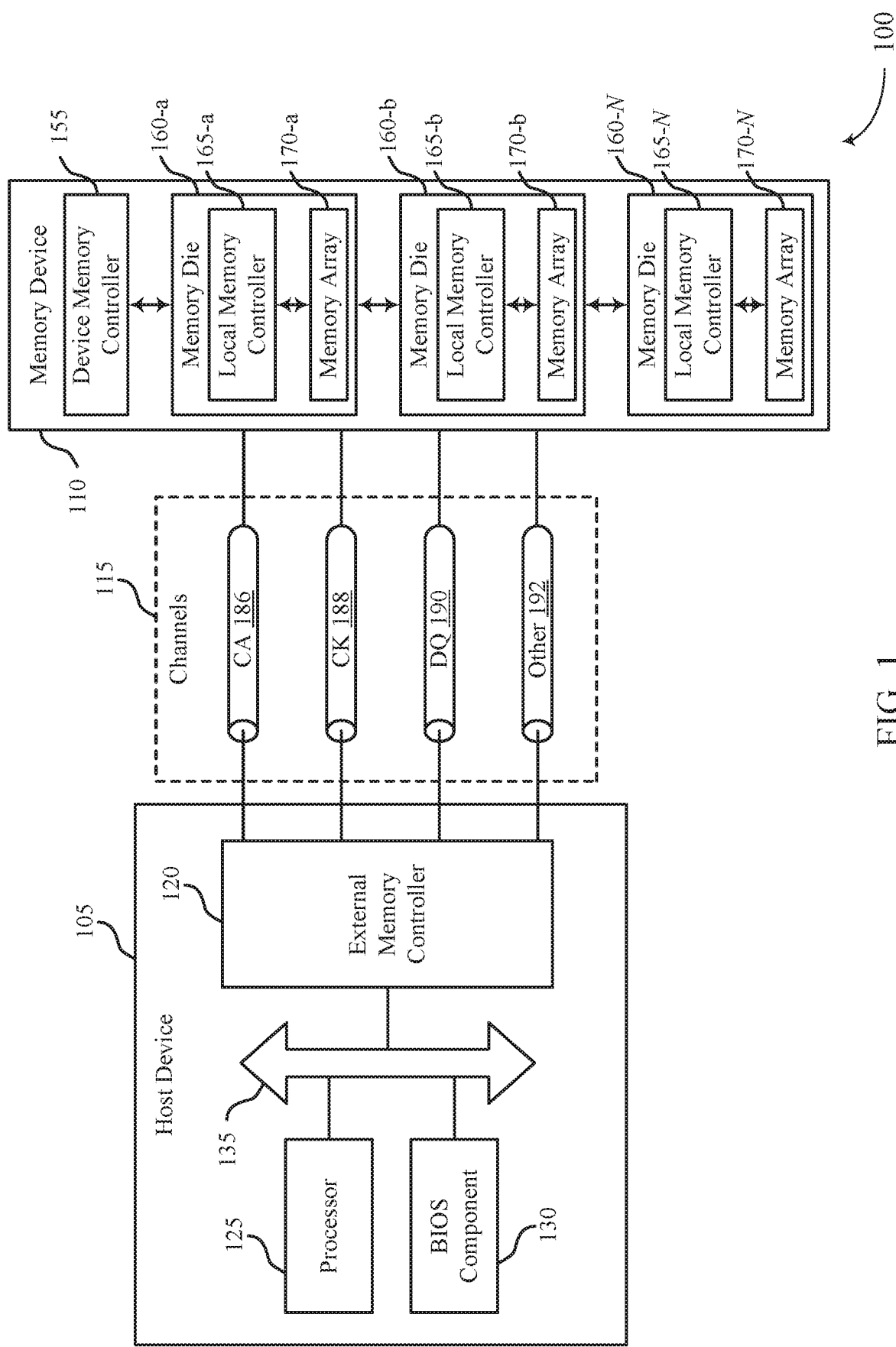
FIG. 1 illustrates an example of a system that supports error control for memory device in accordance with examples as disclosed herein.

FIG. 1 illustrates an example of a system 100 that supports error control for memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory device 110 may be configured to perform error control operations in a memory management operation. For example, the memory device 110 may be configured to perform a memory management operation including a row-copy operation in which each memory cell of a memory source row is copied and stored to a memory target row. The row-copy operation (e.g., memory management operation) may include an error control operation to correct bit errors from being propagated from the source row to the target row. The row-copy operation may further include a column address counter to track whether each memory cell of the source row has been copied, had error control applied via the error control operation, and stored in the target row.

Additionally or alternatively, the memory device 110 may be configured to perform error control operations in a memory management operation such as a sense-copy operation. For example, the memory device 110 may be configured to perform a memory management operation including a sense-copy operation in which data is transferred between different sections of the memory device 110 (e.g., between sections of a memory array 170, between memory arrays 170, and the like). During the sense-copy operation (e.g., memory management operation), data may be read from a first memory cell within a first section of the memory device 110 into a first sense component. An error component may be configured to toggle between the first sense component and a second sense component in order to perform an error control operation and transfer the data from the first sense component to the second sense component. The data may then be transferred from the second sense component to a second memory cell within a second section of the memory device.

Figure 2:
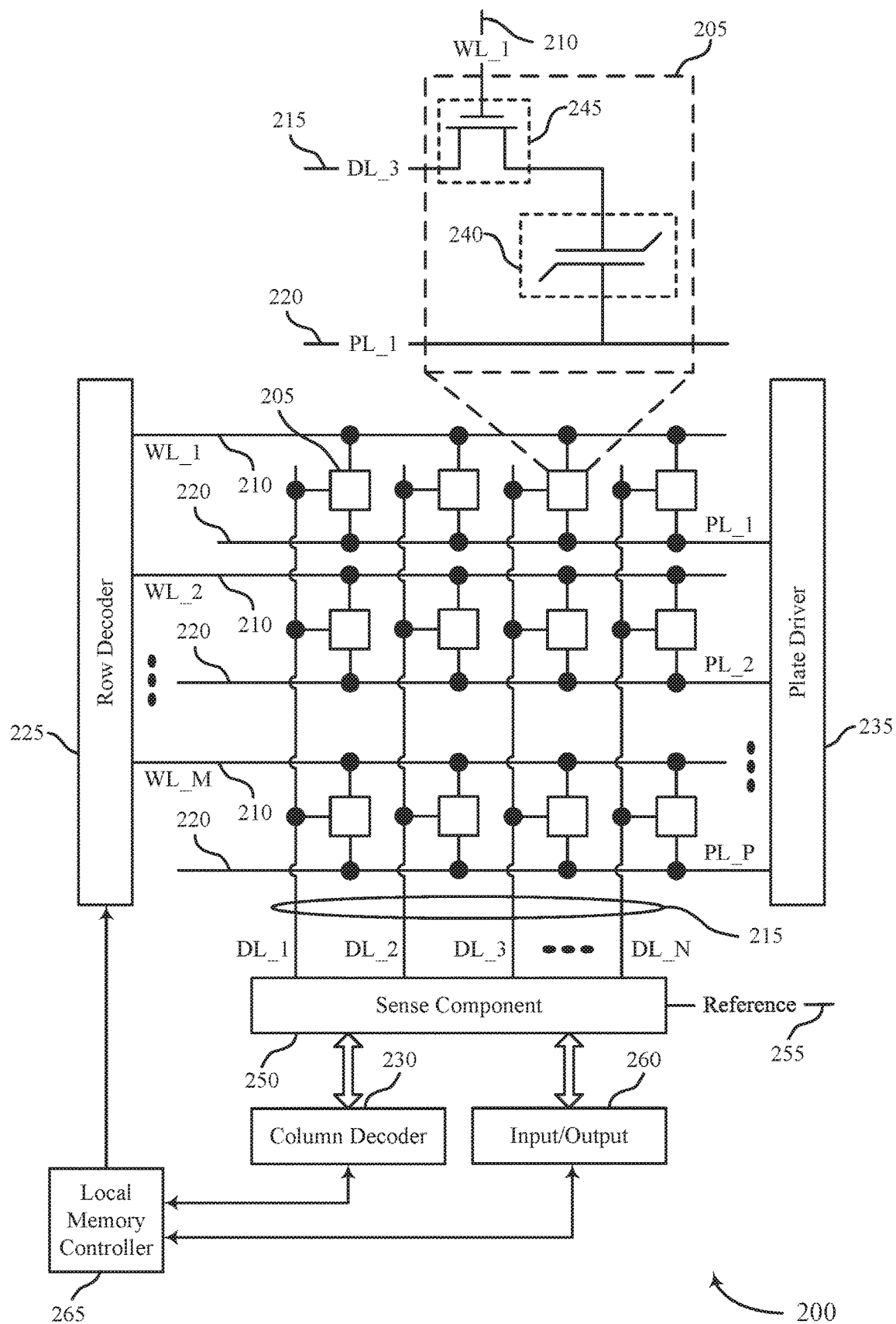
FIG. 2 illustrates an example of a memory die that supports error control for memory device in accordance with examples as disclosed herein.

FIG. 2 illustrates an example of a memory die 200 that supports error control for memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

The memory die 200 (e.g., the local memory controller 265) may be configured to perform error control operations in a memory management operation. For example, the local memory controller 265 may be configured to perform a memory management operation including a row-copy operation in which each memory cell 205 of a source row is copied and stored to a memory cell 205 of a target row. The row-copy operation (e.g., memory management operation) may include an error control operation to correct bit errors from being propagated from the source row to the target row. In this regard, the local memory controller 265 may include, or be communicatively coupled with, an error control component which performs the error control operations on each memory cell 205 during the row-copy operation. The row-copy operation may include a column address counter to track whether each memory cell 205 of the source row has been copied, had error control applied via the error control operation, and stored in a memory cell 205 of the target row.

The memory die 200 (e.g., the local memory controller 265) may additionally or alternatively may be configured to perform error control operations in a memory management operation such as a sense-copy operation. For example, the local memory controller 265 may be configured to perform a memory management operation, including a sense-copy operation, in which data is transferred between different sections of the memory die 200, or between a first memory die 200 and a second memory die 200. During the memory management operation (e.g., sense-copy operation), the local memory controller 265 may read data from a first memory cell 205 within a first section into the sense component 250. An error component may be configured to toggle between the sense component 250 and an additional sense component 250 (e.g., an additional sense component of the memory die, or a sense component 250 of an additional memory die) in order to perform an error control operation and transfer the data from the sense component 250 to the additional sense component 250. The data may then be transferred from the additional sense component 250 to a second memory cell 205 within a second section of the memory device. In this regard, the data of a first memory cell 205 within a first section of the memory die 200 may be copied, had error control applied via the error control operation, and stored in a memory cell 205 within a second section of the memory die 200. Additionally or alternatively, the data of a first memory cell 205 within a first memory die 200 may be copied, had error control applied via the error control operation, and stored in a memory cell 205 within a second memory die 200.

Figure 3:
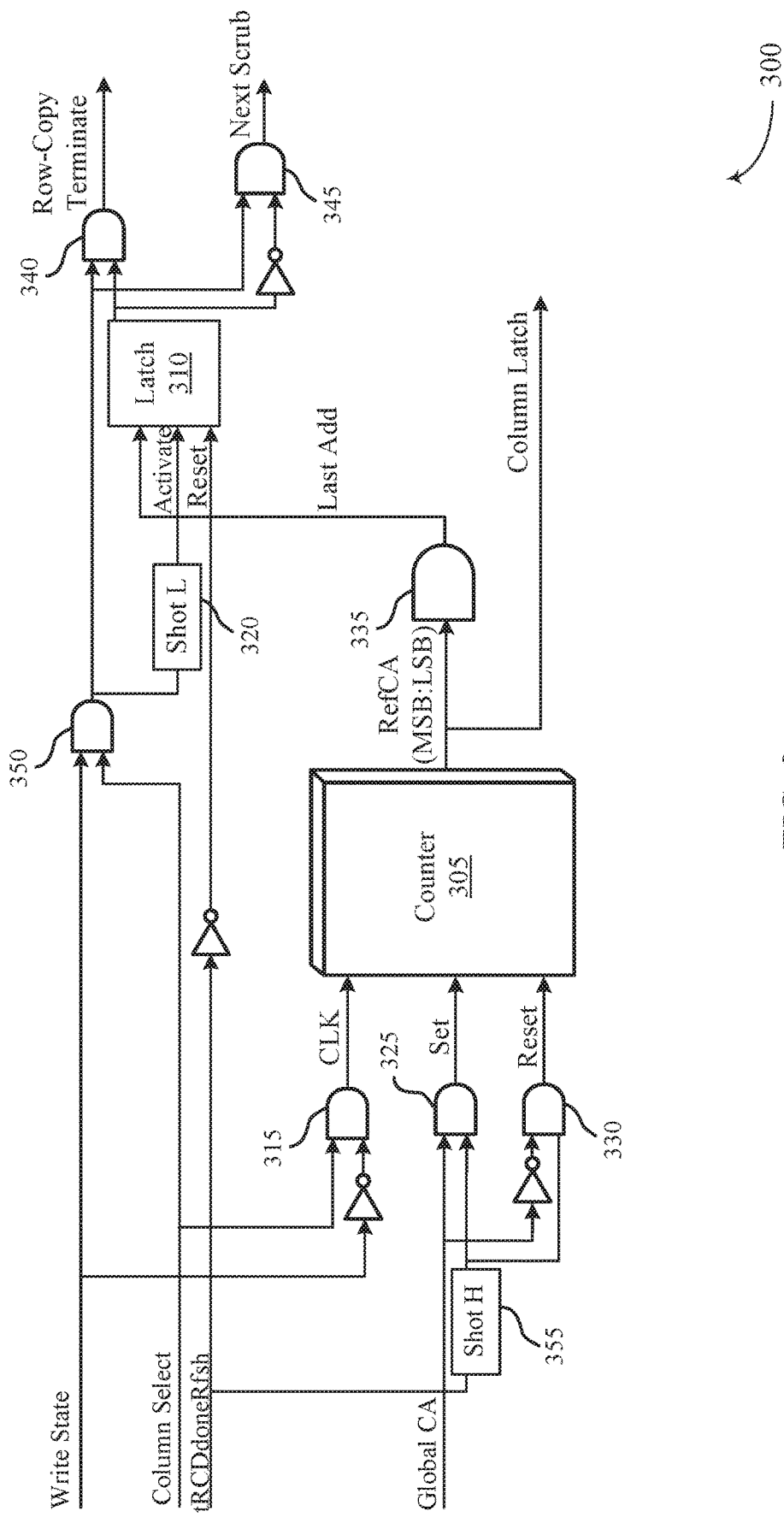
FIG. 3 illustrates an example of a memory device circuitry that supports error control for memory device in accordance with examples as disclosed herein.

FIG. 3 illustrates an example of a memory device circuitry 300 that supports error control for memory device in accordance with examples as disclosed herein. In some examples, the memory device circuitry 300 may include circuitry of a memory die 200, or some portion thereof (e.g., of a local memory controller 265, of a memory array 170).

Some memory devices may use one or more memory management operations to manage the data stored in the memory device. Examples of a memory management operation may include row-copy operations, sense-copy operations, garbage collection operations, wear-leveling operations, or other operations to distribute wear and/or extend the functional life of the memory device. During a row-copy operation, data stored in one row of a memory array (e.g., source row) may be copied and written to a second row of the memory array (e.g., target row). However, some row-copy operations may not include error control aspects, which may cause errors to propagate and/or new errors to be introduced into the data during the row-copy operation. For instance, in the context of a DRAM refresh or row-copy operation, data in a memory cell of a source row may already include one or more errors when the refresh or row-copy operation is performed. In such an example, some row-copy operations may not be able to detect or correct one or more errors in the data, and may therefore propagate the incorrect memory state to the target row. Similarly, a row-copy operation without an error control operation may also introduce new errors into the data during the transfer of information. Propagating errors and/or introducing new errors may cause the memory management operation to be less effective.

Accordingly, techniques are described herein for using error control operations in memory management operations, such as row-copy operations, sense-copy operations, garbage collection operations, wear-leveling operations, other operations, or a combination thereof. In some cases, a row-copy operation may include an error control operation configured to identify one or more errors of the information stored by a source row and correct the determined errors prior to writing the data to a memory cell of the target row. The row-copy operation may further include techniques for tracking whether each memory cell of the source row has been copied, applied with the error control operation, and written to the target row. For example, the memory device circuitry 300 may illustrate example circuitry which determines when the row-copy operation is complete by tracking a column address counter to determine whether each memory cell of the source row has been copied, had error control applied via the error control operation, and stored in a memory cell of the target row. Such techniques may enable improved row-copy operations which prevent propagation of bit errors throughout a memory device 110 (e.g., memory die 200), thereby providing for improved wear-leveling and memory management operations. To implement the error control operations during the memory management operation, a column counter and other control logic may be used to identify when every column of the source row has been read.

The memory device circuitry 300 may receive a set of input signals for performing the row-copy operation. For example, the memory device circuitry 300 may receive a write state signal, a column select signal, a refresh signal, and a global command address signal. The input signals for the memory device circuitry 300 may be received from a host device 105 (e.g., over a CA channel), or may include or be otherwise based on a command issued by a memory device 110 (e.g., from a device memory controller 155 or local memory controller 265). The memory device circuitry 300 may further include a set of logic components (e.g., AND gates, inversion gates, and the like) configured to combine and perform logic commands on the input signals of the memory device circuitry 300.

The memory device circuitry 300 may include a counter 305 which may be configured to determine whether a memory management operation is complete. In particular, the counter 305 may be configured to track (e.g., increment) column addresses of a source row of the memory management operation (e.g., a row-copy operation) to track whether each column (and therefore each memory cell 205) of the source row has been copied, had error control applied via an error control operation, and written to the target row. In this regard, the counter 305 may receive signals, commands, or other indications or triggers related to the memory management operation (e.g., row-copy operation). For example, the counter 305 may include an input clock (CLK) signal, an input set signal, and an input reset signal. The set signal and the reset signal may load the counter 305 with an initial column address associated with the row-copy operation, the CLK signal may periodically pulse to increment the column address counter 305 to provide new column latch values until completion of the row-copy operation.

The memory device circuitry 300 may further include a latch 310. The latch 310 may be an example of a three-input latch configured to receive a last add signal, an activate signal, and a reset signal. The activate signal may be based on the write state signal and the column select signal, and may indicate the beginning of a next time period when a next scrub may start. The activate signal may be configured to cause the latch to output the value being input to the latch through the last add signal. The last add input signal may be received from the counter 305, and may indicate whether the last column of the source row of the row-copy operation has been addressed. The latch 310 may be configured to generate output signals of the row-copy operation. For example, the output of the latch 310 may be used to generate a next scrub signal to trigger the row-copy operation on the next column of the source row, and may be used to generate a row-copy terminate signal when the row-copy operation is completed (e.g., after the last column of the row-copy operation has been addressed). In particular, the last add signal may have a first value when the column address is not the last column address in the source row and may have a second value when the column address is the last column address of the source row, which indicates when the row-operation is complete. In this regard, the latch 310 may generate the row-copy terminate signal indicating the end of the row-copy operation when the last add input signal indicates the last column of the source row.

In order to initiate a row-copy operation, the host device 105 (e.g., over a CA channel) and/or memory device 110 (e.g., from a device memory controller 155 or local memory controller 265) may determine a source row and a target row for the row-copy operation. The host device 105, device memory controller 155, and/or local memory controller 265 may initiate the row-copy operation (e.g., management operation) to transfer information from the source row to the target row of the memory die 200. The host device 105, device memory controller 155, and/or local memory controller 265 may initiate the row-copy operation by generating one or more command signals. The one or more command signals for initiating the row-copy operation may include an indication of a first row address associated with the source row and a second row address associated with the target row. The one or more command signals may further include an indication of a first column address indicating first column of the source address at which the row-copy operation is to begin.

The one or more command signals used to initiate the row-copy operation (e.g., management operation) may include the column select signal, the write state signal, the tRCDdoneRfsh signal, and the global command address (CA) signal. The global CA signal may include multiple address bits to indicate the column address of the source row currently being accessed (e.g., first column address). The row-copy operation may be initiated based on generating the tRCDdoneRfsh signal high with the write state signal low and the column select signal high. The tRCDdoneRfsh signal may indicate that the source row data sensing is complete and that the copy data is latched in a source row. When the tRCDdoneRfsh signal transitions from low to high, the reset status of latch 310 may be released while the output of latch 310 remains low. The tRCDdoneRfsh signal may be supplied to the input of the shot H component 355.

The shot H component 355 may include a one shot pulse generator which is generally low and pulses high. The shot H component 355 may detect a rising edge input and generate a high pulse on the output which is supplied to component 325 and component 330 (e.g., AND component 325 and AND component 330). The component 325 and the component 330 may represent multiple devices (e.g., one device for each of a multiplicity of global address bits, which may be indicated via the global CA signal). Each high global CA bit combined with high pulse from shot H 355 at component 325 may cause the corresponding set bit to set the associated output bit from counter 305 high to represent the state of the global CA bit. Each low global CA bit combined with high pulse from the shot H component 355 at component 330 may cause the corresponding reset bit to reset the associated output bit from counter 305 low to represent the state of the global CA bit. Thus, the low to high transition of the tRCDdoneRfsh signal may cause the starting column address information from the global CA signal to be indicated by the reference command address signal output from counter 305. The reference command address signal may be supplied to component 335 and the column latch (e.g., latch 310). The first column of the source row may be read to the error control logic and the write state input becomes high and writes the first column data from the error control logic to the target row.

The write state signal and the column select signal may be combined via an AND gate 350 or other logic component, which may further be input into a shot L component 320, where the shot L component 320 outputs the latch signal which is provided at the activate input to the latch 310. The shot L component 320 may include a pulse generator which is usually high, and pulses low, as will be described in further detail herein. The pulse low at the activate input to latch 310 may allow a last add output as decoded from reference command address signal by component 335 to be accepted by latch 310 and appear at the latch output. The output of component 350 may be further combined with latch 310 true output to fire a row-copy terminate signal if the last add input to the latch 310 via the reference command address signal was high. The output of the component 350 may be further combined with latch 310 complement output to fire a next scrub signal if the last add signal input to the latch 310 via the reference command address signal was low. If the next scrub signal high indicates the start of another scrub cycle, signal write state signal will transition to a low state. The inverted write state signal may be combined with the continued high state of the column select signal at the component 315 to create a high edge on the CLK input to counter 305. This high CLK edge may cause counter 305 output to count to the next column address via the reference command address signal.

The reference command address signal may be output as a column latch signal, which triggers the row-copy operation for the selected memory cell 205 currently being accessed. The column latch signal may include an indication of the column address of the memory cell 205 currently being accessed for the row-copy operation. In this regard, a sense component 250 of a memory device may read the data of a first memory cell 205 of the source row identified via the first column address indicated in the column latch signal. An error control component may be configured to perform an error control operation on the data stored in the first memory cell 205 based on the column latch signal. During the error control operation, the error control component may determine an error in the data of the first memory cell 205 associated with the first row address and the first column address, and correct the error, if any. Subsequently, the data of the first memory cell 205 of the source row may be written to a memory cell 205 coupled with the target row of the memory die 200. The data of the first memory cell 205 of the source row may be written to the memory cell 205 of the target row based on performing the error control operation.

The last add signal may be generated by processing the output of the counter 305. The counter 305 may output the column address of to be used for the current copy operation or the next copy operation. A component 335 (e.g., AND gate) may be configured to identify when the last column of the source row is being accessed. In some examples, the AND gate may be configured to combine at least a portion of the bits of the column address. When the bits of the column address are the first value (e.g., a logic '1'), the AND gate may output the first value, otherwise the AND gate may output a second value (e.g., a logic '0'). The component 335 used to determine whether the last column address is being accessed or has been accessed may be any type of component used to compare information to a reference or a threshold. The AND gate is just a single example of such a type of a component. The reference command address signal may additionally be input into the component 335 or other logic component configured to determine whether the row-copy operation is complete based on the column address being accessed (e.g., first column address). In particular, the component 335 may be configured to determine whether the column address satisfies a threshold associated with the source row. The threshold associated with the source row may be based on a last column address of the source row. For example, when accessing the first memory cell 205 indicated via the first column address, the component 335 may be configured to combine the one or more bits of the first column address into a value, and compare the value to the threshold associated with the source row.

In this regard, the component 335 may be configured to receive the reference command address signal and output the last add signal. The last add signal may include an indication of whether the row-copy operation is complete. For instance, when the value generated by combining the one or more bits of the first column address satisfies the threshold associated with source row, the last add signal may include an indication of a logic '1,' indicating that the row-copy operation is complete. Conversely, when the value generated by combining the one or more bits of the first column address does not satisfy the threshold associated with source row, the last add signal may include an indication of a logic '0,' indicating that the row-copy operation is not complete.

The latch 310 may receive the last add signal that includes the indication of whether the row-copy operation is complete. The latch 310 may further receive an input latch signal. The input latch signal may be generated based on the column select signal generated by the device memory controller 155 or local memory controller 265. In particular, the column select signal including an indication of the column address of the source row currently being accessed may be input to the shot L component 320, where the shot L component 320 generates the activate signal.

The latch 310 may output a signal which is provided to an AND gate 340 and an AND gate 345. The AND gate 340 may be configured to receive the output signal from the latch 310 and another signal which is based on the write state signal and the column select signal. In cases where the output signal of the latch 310 indicates that the row-copy operation is complete (e.g., the last column of the source row has been copied and written to the target row), the AND gate 340 may generate the row-copy terminate signal, which terminates the row-copy operation. This will be discussed in further detail herein. The AND gate 345 may be configured to receive the output signal from the latch 310 and the signal which is based on the write state signal and the column select signal. In cases where the output signal of the latch 310 indicates that the row-copy operation is not complete (e.g., the last column of the source row has not been copied and written to the target row), the AND gate 345 may generate the next scrub signal.

The next scrub signal may be configured to trigger the write state signal to perform again on a different column address associated with the source row. Additionally or alternatively, the next scrub signal may be configured to cause a column address counter (e.g., counter 305) associated with the source row to increment. In particular, the next scrub signal may be configured to increment a column address counter indicated via the column select signal. In this regard, the next scrub signal may be configured to trigger the row-copy operation to continue to a next column of the source address when it is determined that the row-copy operation is not complete. For example, when the first column address does not satisfy the threshold associated with the source row, the last add signal generated by the component 335 may indicate a "0" indicating the row-copy operation is not complete, which may cause the latch 310 to generate the output signal which triggers the AND gate 345 to output the next scrub signal. In this example, next scrub signal may be configured to fire the write state signal, and increment the column address counter indicated via the column select signal to the next column address of the source row. For instance, the next scrub signal may increment the column address counter to a second column address of the source row.

The re-asserting of the write state signal and the incrementing of the column address counter to the second column address (indicated via the column select signal) may cause the row-copy operation to be initiated for the next memory cell of the source row associated with the source row address and the second column address. The column select signal may be combined with the write state signal by the AND gate 315 and input to the counter 305 as the CLK signal. The write state signal and the column select signal may additionally be combined by the AND gate 350, where the AND gate 350 generates a signal which is provided to the shot L component 320 and the AND gate 340.

The counter 305 may output the reference command address signal (which may include the column address for the current or next column to be part of the row-copy operation) based on the CLK signal and the set signal. The reference command address signal may include an indication of a column address of a memory cell 205 of the source row which is currently being accessed. For example, when performing the row-copy operation on the second memory cell 205 of the source row indicated by the second column address count, the reference command address signal may include an indication of the second column address.

The sense component 250 of the memory die 200 may read the data stored in a second memory cell 205 at the source row address and the second column address. An error control component may be configured to perform an error control operation on the data stored in the second memory cell 205. During the error control operation, the error control component may determine whether an error exists in the data of the second memory cell 205 associated with the first row address and the second column address, and correct the error, if any. Subsequently, the data of the second memory cell 205 of the source row may be written to a second memory cell 205 coupled with the target row of the memory die 200. The data of the second memory cell 205 of the source row may be written to a memory cell 205 of the target row based on performing the error control operation.

The reference command address signal may additionally be input into the component 335 or other logic component configured to determine whether the row-copy operation is complete based on the column address being accessed (e.g., second column address). The component 335 may be configured to determine whether the column address indicated by the reference command address signal satisfies the threshold associated with the source row. The threshold associated with the source row may be based on a last column address of the source row. For example, when accessing the second memory cell 205 indicated via the second column address, the component 335 may be configured to combine the one or more bits of the second column address into a value, and compare the value associated with the source row. In this regard, the component 335 may be configured to receive the reference command address signal and output the last add signal. The last add signal may be used to indicate whether the row-copy operation is complete. For instance, when the value generated by combining the one or more bits of the second column address satisfies the threshold associated with source row, the last add signal may include an indication of "1," indicating that the row-copy operation is complete. Conversely, when the value generated by combining the one or more bits of the second column address does not satisfy the threshold associated with source row, the last add signal may include an indication of "0," indicating that the row-copy operation is not complete.

The latch 310 may receive the last add signal including the indication of whether the row-copy operation is complete. The latch 310 may further receive an activate signal, which may be based on the column select signal. In particular, the column select signal including an indication of the column address of the source row currently being accessed may be input to the shot L component 320, where the shot L component 320 generates the activate signal. The latch 310 may generate an output signal which is provided to the AND gate 340 and the AND gate 345.

The AND gate 345 may be configured to receive the output signal from the latch 310 and the signal which is based on the write state signal and the column select signal. In cases where the output of the latch 310 indicates that the row-copy operation is not complete (e.g., the last column of the source row has not been copied and written to the target row), the AND gate 345 may generate the next scrub signal. For example, in cases where the second column address is not the last column address of the source row, the latch 310 may generate the output signal which causes the AND gate 345 to generate the next scrub signal. The next scrub signal may be configured to re-assert the write state signal again, and increment a column address counter associated with the source row. In particular, the next scrub signal may be configured to cause the column address counter to increment via the column select signal. In this regard, the next scrub signal may be configured to trigger the row-copy operation to continue to a next column of the source row when it is determined that the row-copy operation is not complete. For example, when the second column address does not satisfy the threshold associated with the source row, the last add signal generated by the AND gate 335 may indicate a "0" indicating the row-copy operation is not complete, which may cause the latch 310 to generate the output signal which triggers the AND gate 345 to output the next scrub signal. In this example, next scrub signal may be configured to fire the write state signal, and increment the column address counter indicated via the column select signal to the next column address of the source row. For instance, the next scrub signal may increment the column address counter to a third column address of the source row.

The AND gate 340 may be configured to receive the output signal of the latch 310 and another signal which is based on the write state signal and the column select signal. In cases where the output signal of the latch 310 indicates that the row-copy operation is complete (e.g., the last column of the source row has been copied and written to the target row), the AND gate 340 may generate the row-copy terminate signal, which terminates the row-copy operation. For example, when the second column address satisfies the threshold associated with the source row, the last add signal may indicate a "1" indicating the row-copy operation is complete, which may cause the latch 310 to generate the output signal which triggers the AND gate 340 to output the row-copy terminate signal.

The row-copy terminate signal may indicate that every column of the source row has been addressed by the row-copy operation. In this regard, the row-copy terminate signal may indicate the end of the row-copy operation for the source row. The row-copy terminate signal may trigger the refresh signal (e.g., tRCD done signal) to fire. The refresh signal may be sent to local memory controller 165 to terminate the row copy operation.

The target row may be precharged after the row-copy operation is complete. In some cases, the device memory controller 155 and/or local memory controller 265 may generate a signal configured to precharge the target row based on determining that the memory management operation (e.g., row-copy operation) is complete.

The techniques described herein with respect to the memory device circuitry 300 may enable improved memory management operations. More particularly, the memory device circuitry 300 may enable a row-copy operation including an error control operation configured to prevent the row-copy operation from propagating errors from the source row to the target row. Additionally or alternatively, the memory device circuitry 300 may enable tracking of a column address counter of the source row to ensure that the row-copy operation (and error control operation) is performed on each memory cell 205 (e.g., each column address) of the source row.

Figure 4:
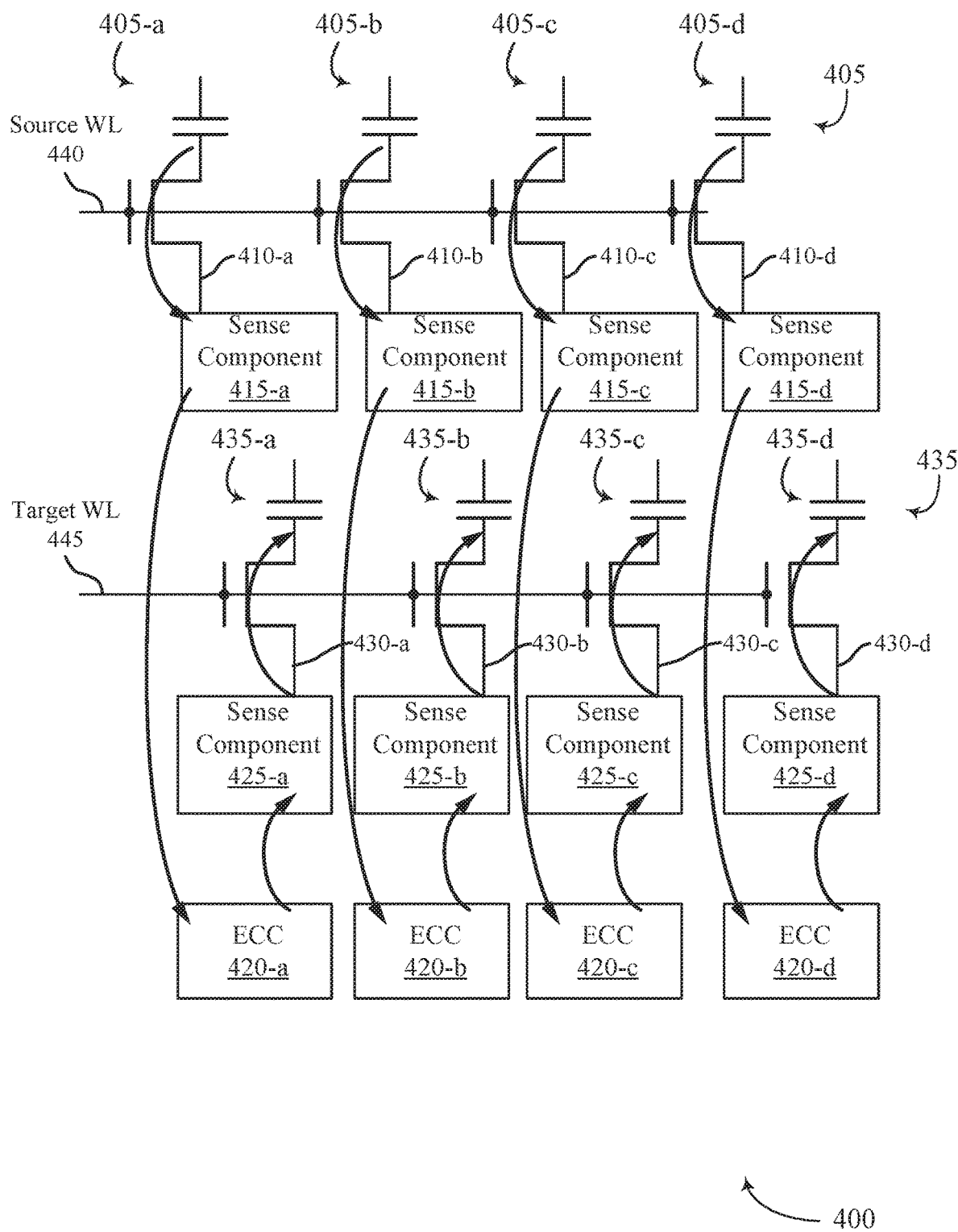
FIG. 4 illustrates an example of a memory device circuitry that supports error control for memory device in accordance with examples as disclosed herein.

FIG. 4 illustrates an example of a memory device circuitry 400 that supports error control for memory device in accordance with examples as disclosed herein. In some examples, the memory device circuitry 300 may include circuitry of a memory die 200, or some portion thereof (e.g., of a local memory controller 265, of a memory array 170).

Some memory devices may perform memory management operations such as a sense-copy operation in order to implement wear-leveling and manage the data stored in the memory device. During a sense-copy operation, data from a first memory cell may be read into a sense component, and transferred to a second memory cell different than the first memory cell. However, some sense-copy operations may not include error control aspects, which may cause errors to propagate and/or new errors to be introduced into the data during the sense-copy operation. Moreover, some sense-copy operations are performed through a single sense component, and are able to transfer data between memory cells within the same section. For example, some sense-copy operations may be unable to transfer data from a first memory cell in a first section of a memory device to a second memory cell in a second section of the memory device. As it is used herein, the term "section" may be used to refer to any sub-set of a memory device known in the art. For example, in some cases, a first section may refer to a first set of sense amplifiers that are independently addressable relative to a second set of sense amplifiers. The second set of sense amplifiers may be in a second section. By way of another example, a first section may refer to a first region within a memory die, and a second section may refer to a second region within the memory die.

Techniques are described herein for using error control operations and a set of sense components to perform sense-copy operations between sections of a memory device. For example, the sense-copy operation may be performed to transfer data between different sections of the memory die 200, or between a first memory die 200 and a second memory die 200. In some cases, a sense-copy operation may include an error control operation configured to determine and correct an error within a first memory cell prior to copying the data of the first memory cell to a second memory cell. During the sense-copy operation (e.g., memory management operation), the local memory controller 265 may read data from a first memory cell 205 within a first section into the sense component 250. An error component may be configured to toggle between the sense component 250 and an additional sense component 250 associated with the target address for the data (e.g., an additional sense component of the memory die 200, or a sense component 250 of an additional memory die 200). The error control component may be configured to perform the error control operation to determine and correct bit errors in the data of the first memory cell 205 before transferring the data to the additional sense component 250. The data may then be transferred from the additional sense component 250 to a second memory cell 205 within a second section of the memory device. Such techniques may enable improved sense-copy operations which prevent propagation of bit errors throughout a memory device 110 (e.g., memory die 200), thereby providing for improved wear-leveling and memory management operations. Furthermore, techniques of the present disclosure may enable sense-copy operations to be performed between two different sections of a memory device, thereby improving flexibility of wear-leveling and data management.

The memory device circuitry 400 may include a first set of memory cells 405 and a second set of memory cells 435. The first set of memory cells 405 may include memory cells 405-a, 405-b, 405-c, and 405-d and the second set of memory cells 435 may include memory cells 435-a, 435-b, 435-c, and 435-d. The first set of memory cells 405 may be associated with (e.g., coupled to) a first word line 440 (e.g., source word line 440), and the second set of memory cells 435 may be associated with a second word line 445 (e.g., target word line 445). In some cases, a first section of a memory device 110 may include the first set of memory cells 405, and a second section of the memory device 110 may include the second set of memory cells 435. For example, a first section may include the first set of memory cells 405, and a second section may include the second set of memory cells 435. In some aspects, the first section may be associated with a first section address, and the second section may be associated with a second section address.

A sense-copy operation may be configured to transfer the data from the first set of memory cells 405 to the second set of memory cells 435. In cases where the first set of memory cells 405 and the second set of memory cells 435 are disposed in different sections of a memory device 110 (e.g., different sections of a memory array 170), the sense-copy operation may be configured to transfer data from one section of the memory device 110 to another section of the memory device 110. The memory device circuitry 400 may receive one or more input signals for initiating the sense-copy operation. The one or more input signals configured to initiate the sense-copy operation may be received from a host device 105 (e.g., over a CA channel), or may include or be otherwise based on a command issued by a memory device 110 (e.g., from a device memory controller 155 or local memory controller 265).

During the sense-copy operation, data from a first memory cell 405-a may be read into a first sense component 415-a. In some cases, the first memory cell 405-a and/or the first sense component 415-a may be included within a first section of the memory device. For example, the first memory cell 405-a and the first sense component 415-a may be included within a first section of the memory device and/or memory array. The data may be transferred from the first memory cell 405-a to the first sense component 415-a via a first digit line 410-a associated with the first section. Additionally, the data may be read from the first memory cell 405-a to the first sense component 415-a by activating the first sense component 415-a of the first section. In some cases, the first sense component 415-a may be activated by the host device 105, device memory controller 155, and/or the local memory controller 265.

The data may then be transferred from the first sense component 415-a to an error control component 420-a. The error control component 420-a may be configured to perform an error control operation on the data. The error control component 420-a may perform the error control operation on the data based on the data being transferred to the error control component 420-a. During the error control operation, the error control component 420-a may determine that the data of the first set of memory cells includes one or more errors, and correct the errors, if any. The error control component 420-a may be disposed within the first section or the second section of the memory device or memory array. For example, in some cases, the error control component 420-a may be included within the first section along with the first memory cell 405-a and the first sense component 415-a. By way of another example, in other cases, the error control component 420-a may be included within the second section. In other cases, the error control component 420 may be positioned in any portion of a memory device and may not be associated with the first section or the second section specifically.

In some cases, the data may be transferred from the first sense component 415-a in the first section to the error control component 420-a via a data line. The data lines may be routed throughout the memory device and/or memory array, and may traverse from the first section to the second section. In this regard, the data may be transferred from the first sense component 415-a in the first section to the error control component 420-a in the second section via a data line that is routed from the first section to the second section.

In some cases, the data may be transferred from the first sense component 415-a to the error control component 420-a based on latching a section address of the first sense component 415-a in a first latch. For example, a first section address associated with the first section (e.g., first section address associated with the first sense component 415-a within the first section) may be stored in a first latch. In this example, the data may be transferred from the first sense component 415-a to the error control component 420-a based on storing the first section address associated with the first sense component 415-a in the first latch.

The data may be transferred from the error control component 420-a to a second sense component 425-a, as shown in FIG. 4. The second sense component 425-b may be associated with the second section of the memory device or memory array. In some cases, the data may be transferred from the error control component 420-a to the second sense component 425-a in the second section to the via a data line. The data lines may be routed throughout the memory device 110 and/or memory array 170, and may traverse from the first section to the second section.

In some aspects, the error control component 420-a may be configured to toggle between the first sense component 415-a and the second sense component 425-a in order to transfer the data between the first sense component 415-a and the second sense component 425-a. For example, the data may be read from the first memory cell 405-a to the first sense component 415-a by activating the first sense component 415-a associated with the first section. In this example, the activation of the first sense component may be maintained in order to transfer data from the first sense component 415-a to the error control component 420-a, and from the error control component 420-a to the second sense component 425-a associated with the second section. In this regard, the error control component 420-a may be configured to toggle between the first sense component 415-a and the second sense component 415-*b* to transfer data between the two based on maintaining the activation of the first sense component 415-*a*.

The second sense component 425-*a* may be activated to transfer the data from the error control component 420-*a* to the second sense component 425-*b*. In this regard, the data may be transferred from the error control component 420-*a* to the second sense component 425-*a* based on activating the second sense component 25-*a*. In some cases, the second sense component 425-*a* may be activated base on performing the error control operation by the error control component 420-*a*. In some cases, the second sense component 425-*a* may be activated by the host device 105, device memory controller 155, and/or the local memory controller 265.

In some cases, the data may be transferred from the error control component 420-*a* to the second sense component 425-*a* based on latching a section address of the second sense component 425-*a* in a second latch. For example, a second section address associated with the second section (e.g., second section address associated with the second sense component 425-*a* within the second section) may be stored in a second latch. In this example, the data may be transferred from the error control component 420-*a* to the second sense component 425-*a* based on storing the second section address associated with the second sense component 425-*a* in the second latch.

The data may be transferred from the second sense component 425-*a* to the memory cell 435-*a*. The memory cell 435-*a* may be associated with (e.g., disposed within) the second section of the memory device 110 or memory array 170. In some cases, the data may be transferred from the second sense component 425-*a* to the memory cell 435-*a* via a second digit line 430-*a* associated with the second section.

The data stored within the memory cells 405-*b*, 405-*c*, and 405-*d* may similarly be transferred to the memory cells 435-*b*, 435-*c*, and 435-*d* throughout the sense-copy operation. In this regard, any description associated with transferring data from the memory cell 405-*a* to the memory cell 435-*a* may additionally be understood to apply to the transfer of data between the memory cells 405-*b*, 405-*c*, and 405-*d* and the memory cells 435-*b*, 435-*c*, and 435-*d*. For example, the data of the memory cell 405-*b* may be transferred to the memory cell 435-*b* via the digit line 410-*b*, the sense component 415-*b*, the error control component 420-*b*, the sense component 425-*b*, and the digit line 430-*b*.

While the sense components 415-*a*, 415-*b*, 415-*c*, and 415-*b*, the sense components 425-*a*, 425-*b*, 425-*c*, and 425-*d*, and the error control components 420-*a*, 420-*b*, 420-*c*, and 420-*d* are shown and described as including separate components, this is not to be regarded as a limitation of the present disclosure, unless noted otherwise herein. In this regard, two or more components may be combined into a single component. For example, in some cases, the error control components 420-*a*, 420-*b*, 420-*c*, and 420-*d* may include a single error control component configured to perform error control operations for transferring the data between each respective memory cell of the first set of memory cells 405 and the second set of memory cells 435. Similarly, in some cases the sense components 415-*a*, 415-*b*, 415-*c*, and 415-*b* may include a single sense component associated with the first section, and the sense components 425-*a*, 425-*b*, 425-*c*, and 425-*d* may include a single sense component associated with the second section.

Figure 5:
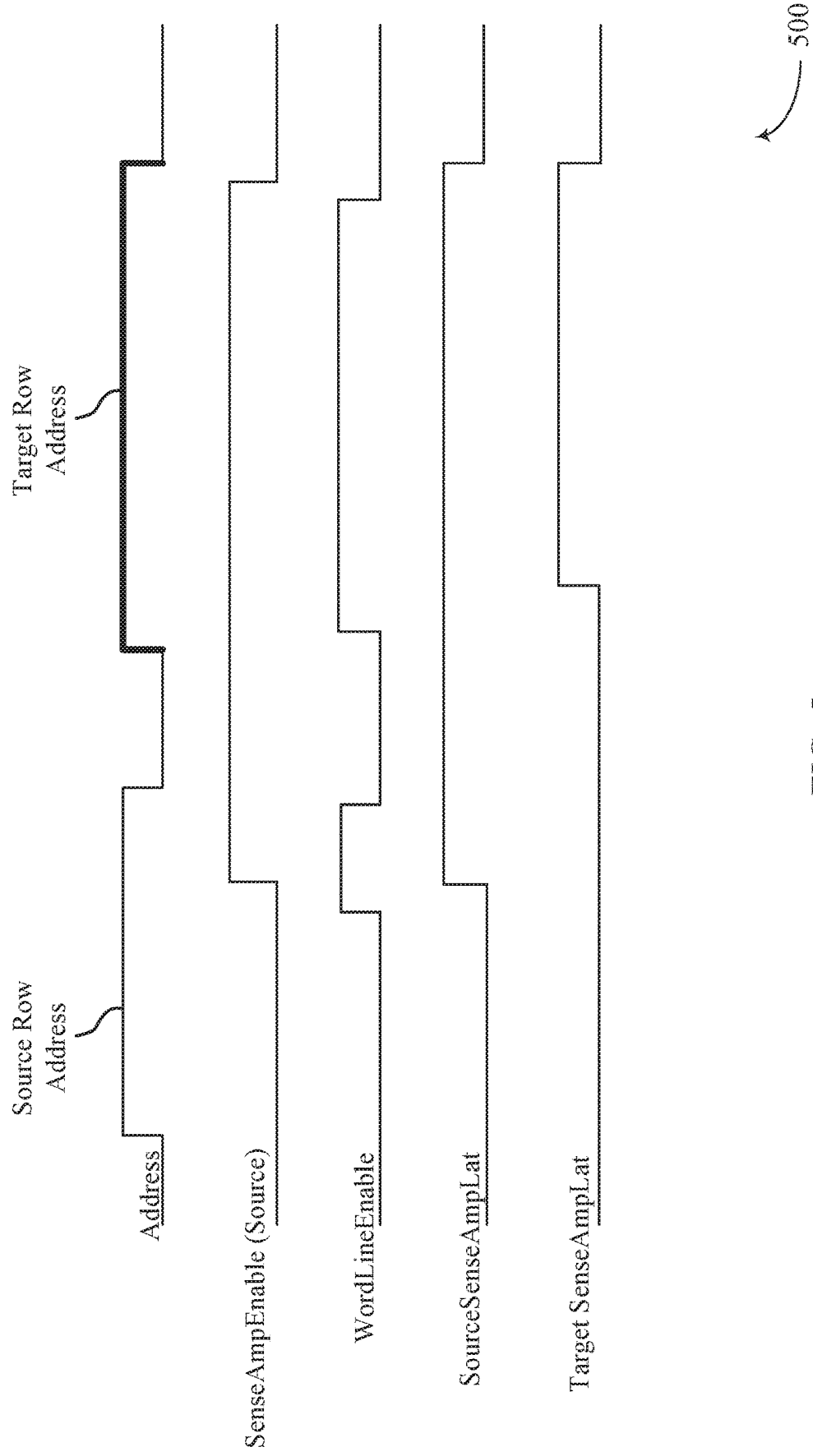
FIG. 5 illustrates an example of a timing diagram that supports error control for memory device in accordance with examples as disclosed herein.

FIG. 5 illustrates an example of a timing diagram 500 that supports error control for memory device in accordance with examples as disclosed herein. The timing diagram 500 illustrates an example of sequential disabling and enabling of voltage sources that may be associated with a sense-copy operation. Additionally, the timing diagram 500 illustrates an example of sequential disabling and enabling of voltage sources that may be associated with components or operations of a memory die 200. In one example, the voltages of the timing diagram 500 may be associated with the memory device circuitry 400 described with reference to FIG. 4. However, the described techniques are applicable to other components, configurations, and quantities of voltage sources of a memory die 200.

In performing sense-copy operation to copy memory cells 205 of a source row (e.g., memory cells 405) within a first section to memory cells 205 of a target row in a target section (e.g., memory cells 435), the memory die 200 may activate the source row address associated with the source row by generating a source row address signal. After the source row address becomes valid (e.g., activated), a source word line associated with the source row may be activated by generating a WordLineEnable signal. The source row address signal and the WordLineEnable signal may be configured to allow the memory die 200 to access the memory cells of the source row to be copied during the sense-copy operation.

After the source row address and the word line of the memory cell 205 are both activated (e.g., source row address signal and the WordLineEnable signal are both activated), the memory die 200 may activate a sense component associated with the source row (e.g., sense component 415) by generating a SenseAmpEnable. The sense component (e.g., sense component 415) associated with the source row may be activated at some time after the source row is activated in order to read (e.g., sense) the data within the memory cell 205 of the source row currently being accessed. Subsequently, the memory die 200 may latch the source row by generating a SourceSenseAmpLat signal.

The activation of the sense component may be maintained (e.g., SenseAmpEnable signal stays activated) so that the scrubbing may be performed back and forth from the data maintained in the sense component (e.g., sense component 415). Comparatively, once the source row has been latched and the data of the memory cell 205 within the source row has been read into the sense component, the WordLineEnable signal may go low, thereby releasing the activation of the source word line. In this regard, the WordLineEnable signal may be pulsed low in order to allow the memory die 200 to deactivate the source row address and to activate a target row address. After the target row address has been activated, the WordLineEnable signal may again be activated. Additionally, after the target row address and the word line are both activated, the memory die 200 may generate a TargetSenseAmpLat signal in order to activate and latch a sense component associated with the target row (e.g., sense component 425).

The memory die 200 may maintain the activation of the source sense component (e.g., sense component 415) and the target sense component (e.g., sense component 425), as illustrated by the SenseAmpEnable signal and the TargetSenseAmpLat signal, in order to scrub (e.g., toggle) back and forth with the error control component 420 between the source sense component 415 and the target sense component 425. In this regard, the error control component may toggle between the source sense component and the target sense component in order to transfer the data from the source sense component to the target sense component.

Figure 6:
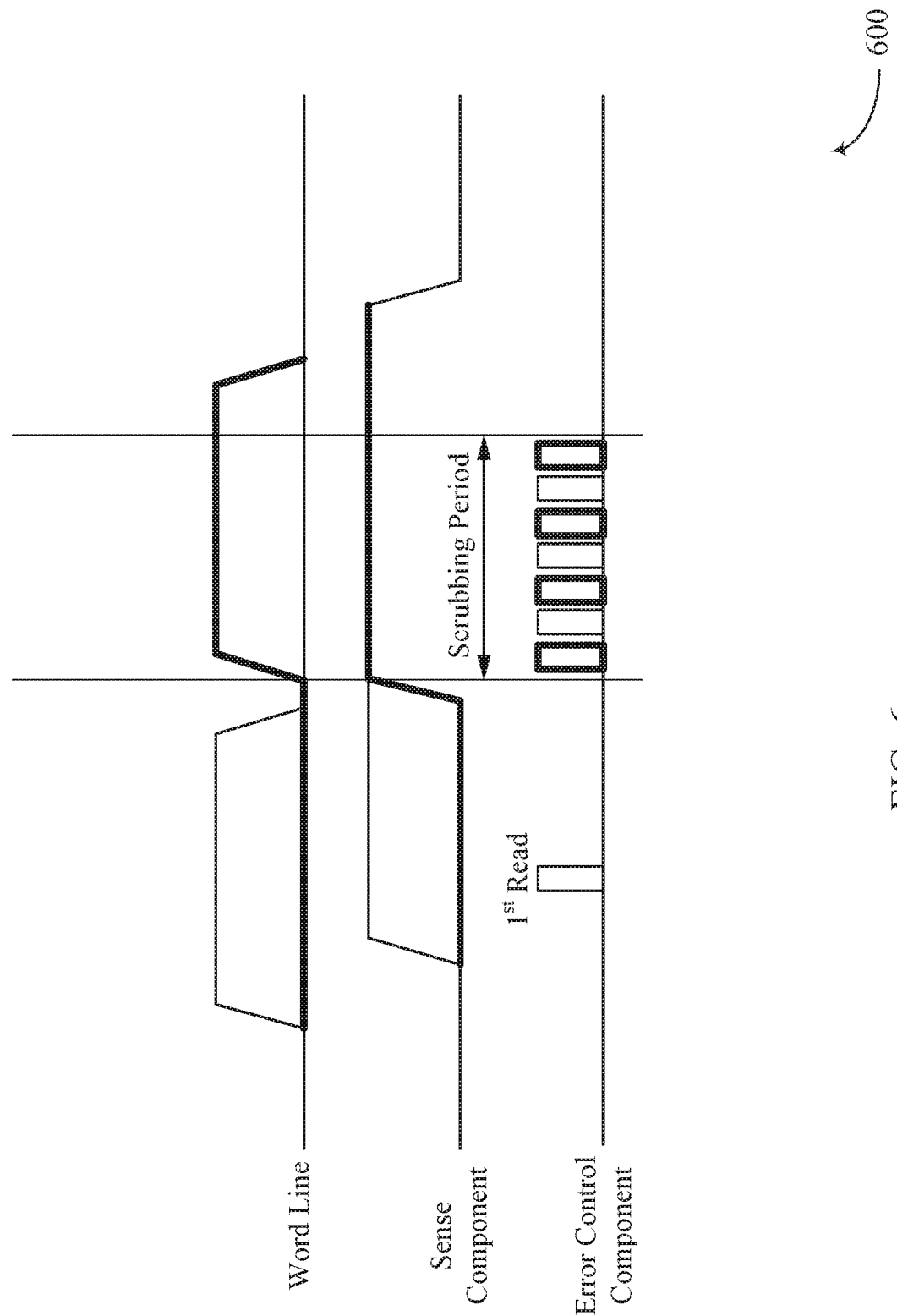
FIG. 6 illustrates an example of a timing diagram that supports error control for memory device in accordance with examples as disclosed herein.

FIG. 6 illustrates an example of a timing diagram 600 that supports error control for memory device in accordance with examples as disclosed herein. The timing diagram 600 illustrates an example of sequential disabling and enabling of voltage sources that may be associated with a sense-copy operation. Additionally, the timing diagram 600 illustrates an example of sequential disabling and enabling of voltage sources that may be associated with components or operations of a memory die (e.g., memory die 200). In one example, the voltages of the timing diagram 600 may be associated with the memory device circuitry 400 described with reference to FIG. 4 and the timing diagram 500 described with reference to FIG. 5. However, the described techniques are applicable to other components, configurations, and quantities of voltage sources of a memory die.

When performing a sense-copy operation, the memory die may generate a activate a word line of the source row (e.g., source word line 440). Sometime after the word line of the source row is activated, the memory die 200 may activate a sense component associated with the first row (e.g., sense component 415). A first read of one or more memory cells 205 within the source row (e.g., memory cells 405) to an error control component (e.g., error control component 420) may be performed at a time when both the source word line and the source sense component are activated.

Subsequently, the activation of the source word line may be released, and the memory die may activate the target word line (e.g., target word line 445). The memory die may additionally activate a target sense component (e.g., sense component 425). The memory die may maintain the activation of the source sense component (e.g., sense component 415) as well as the activation of the target sense component (e.g., target sense component 425) in order to scrub back and forth with the error control component (e.g., error control component 420) between the source sense component and the target sense component. In this regard, the error control component may toggle between the source sense component and the target sense component in order to transfer the data from the source sense component to the target sense component. During the scrubbing period, the memory die may maintain the activation of the target word line (e.g., target word line 445) so that the data may be transferred from the error control component to the target sense component throughout the scrubbing period. Accordingly, the bolded portions within the scrubbing period may additionally or alternatively illustrate write pulses which transfer the data to the target sense component, and write the data from the target sense component to the target memory cell.

Figure 7:
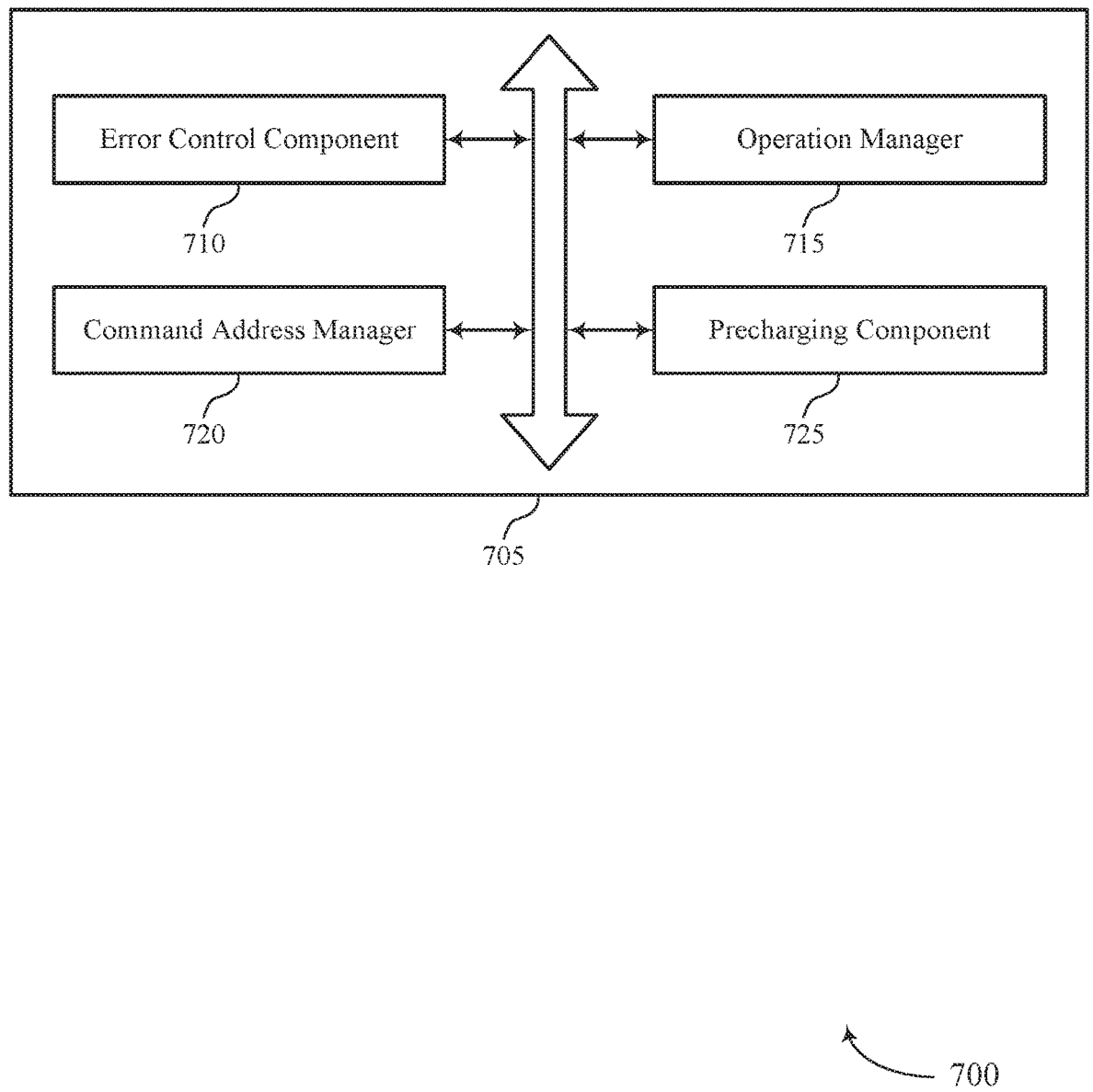
FIG. 7 shows a block diagram of a memory device that supports error control for memory device in accordance with examples as disclosed herein.

FIG. 7 shows a block diagram 700 of a memory device 705 that supports error control for memory device in accordance with examples as disclosed herein. The memory device 705 may be an example of aspects of a memory device as described with reference to FIGS. 1-6. The memory device 705 may include an error control component 710, an operation manager 715, a command address manager 720, and a precharging component 725. Each of these components may communicate, directly or indirectly, with one another (e.g., via one or more buses).

The error control component 710 may perform an error control operation on data stored in a first memory cell coupled with the source row of the memory device based on initiating the management operation, the first memory cell located at a first column address and a first row address of the source row. In some examples, the error control component 710 may perform an error control operation on the data with the error control component based on transferring the data to the error control component. In some examples, the error control component 710 may read the data of the first memory cell. In some examples, the error control component 710 may determine an error in the data of the first memory cell. In some examples, the error control component 710 may correct the error based on determining the error.

In some examples, the error control component 710 may toggle, by the error control component, between the first sense component of the first section and the second sense component of the second section to transfer a set of data between the first sense component and the second sense component based on transferring the data to the second memory cell. In some examples, the error control component 710 may maintain an activation of the first sense component after transferring the data from the first sense component to the error control component, where toggling between the first sense component of the first section and the second sense component of the second section is based on maintaining the activation of the first sense component. In some examples, the error control component 710 may transfer the data from the error control component to a second sense component associated with the second section of the memory device. In some cases, the first section includes the first memory cell. In some cases, the second section includes the second memory cell.

The operation manager 715 may initiate a management operation to transfer information from a source row to a target row of a memory device. In some examples, the operation manager 715 may write the data to a second memory cell coupled with the target row of the memory device based on performing the error control operation on the data.

In some examples, the operation manager 715 may determine whether the management operation is complete based on the first column address of the first memory cell. In some examples, the operation manager 715 may generate an output signal to perform the error control operation on a third memory cell coupled with the source row based on determining whether the management operation is complete. In some examples, the operation manager 715 may read data of a first memory cell into a first sense component as part of a management operation to transfer information from a first section to a second section of a memory device. In some examples, the operation manager 715 may generate a write state signal and a global command address signal including an indication for a command address counter.

In some examples, the operation manager 715 may activate the first sense component of the first section, where reading the data is based on activating the first sense component. In some examples, the operation manager 715 may activate the second sense component of the second section based on performing the error control operation, where transferring the data from the error control component to the second sense component is based on activating the second sense component. In some examples, the operation manager 715 may transfer the data from the first memory cell to the first sense component via a first digit line associated with the first section of the memory device.

The command address manager 720 may determine whether the first column address satisfies a threshold associated with the source row. In some examples, the command address manager 720 may combine one or more bits of the first column address into a value. In some examples, the command address manager 720 may compare the value with the threshold associated with the source row, where determining whether the first column address satisfies the threshold is based on comparing the value with the threshold. In some examples, the command address manager 720 may increment a column address counter associated with the source row based on generating the output signal. In some examples, the command address manager 720 may identify a second column address of the third memory cell based on incrementing the column address counter. In some examples, the command address manager 720 may determine that the management operation is complete based on a third column address associated with the third memory cell. In some examples, the command address manager 720 may determine that the third column address satisfies a threshold associated with the source row.

The precharging component 725 may precharge the target row based on determining the management operation is complete.

Figure 8:
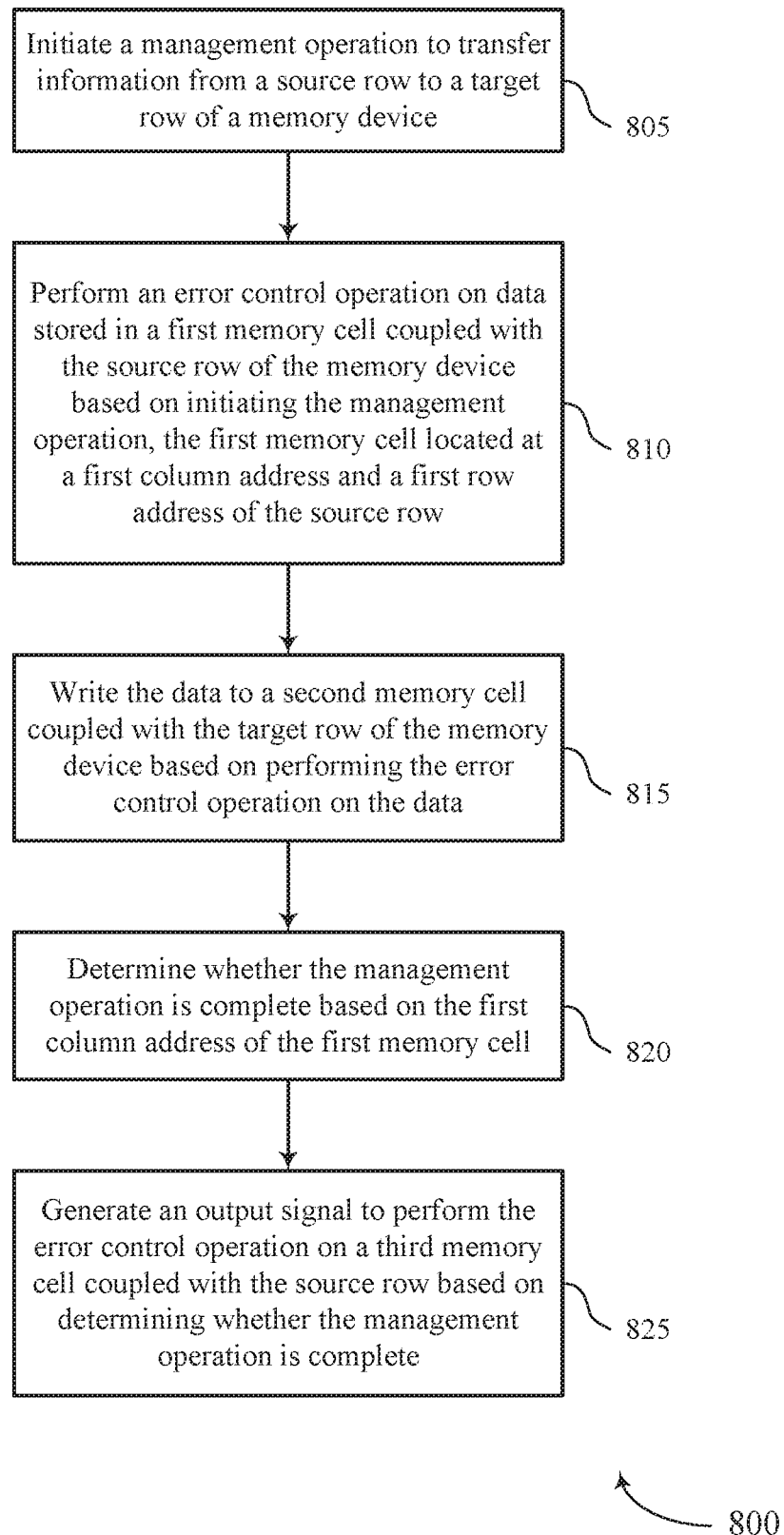
FIGS. 8 and 9 show flowcharts illustrating a method or methods that support error control for memory device in accordance with examples as disclosed herein.

FIG. 8 shows a flowchart illustrating a method or methods 800 that supports error control for memory device in accordance with examples as disclosed herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may initiate a management operation to transfer information from a source row to a target row of a memory device. The operations of 805 may be performed according to the methods described herein. In some examples, aspects of the operations of 805 may be performed by an operation manager as described with reference to FIG. 7.

At 810, the memory device may perform an error control operation on data stored in a first memory cell coupled with the source row of the memory device based on initiating the management operation, the first memory cell located at a first column address and a first row address of the source row. The operations of 810 may be performed according to the methods described herein. In some examples, aspects of the operations of 810 may be performed by an error control component as described with reference to FIG. 7.

At 815, the memory device may write the data to a second memory cell coupled with the target row of the memory device based on performing the error control operation on the data. The operations of 815 may be performed according to the methods described herein. In some examples, aspects of the operations of 815 may be performed by an operation manager as described with reference to FIG. 7.

At 820, the memory device may determine whether the management operation is complete based on the first column address of the first memory cell. The operations of 820 may be performed according to the methods described herein. In some examples, aspects of the operations of 820 may be performed by an operation manager as described with reference to FIG. 7.

At 825, the memory device may generate an output signal to perform the error control operation on a third memory cell coupled with the source row based on determining whether the management operation is complete. The operations of 825 may be performed according to the methods described herein. In some examples, aspects of the operations of 825 may be performed by an operation manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for initiating a management operation to transfer information from a source row to a target row of a memory device, performing an error control operation on data stored in a first memory cell coupled with the source row of the memory device based on initiating the management operation, the first memory cell located at a first column address and a first row address of the source row, writing the data to a second memory cell coupled with the target row of the memory device based on performing the error control operation on the data, determining whether the management operation is complete based on the first column address of the first memory cell, and generating an output signal to perform the error control operation on a third memory cell coupled with the source row based on determining whether the management operation is complete.

In some examples of the method 800 and the apparatus described herein, determining whether the management operation may be complete may include operations, features, means, or instructions for determining whether the first column address satisfies a threshold associated with the source row.

Some examples of the method 800 and the apparatus described herein may further include operations, features, means, or instructions for combining one or more bits of the first column address into a value, and comparing the value with the threshold associated with the source row, where determining whether the first column address satisfies the threshold may be based on comparing the value with the threshold.

In some examples of the method 800 and the apparatus described herein, performing the error control operation on the data stored in the first memory cell may include operations, features, means, or instructions for reading the data of the first memory cell, determining an error in the data of the first memory cell, and correcting the error based on determining the error.

Some examples of the method 800 and the apparatus described herein may further include operations, features, means, or instructions for incrementing a column address counter associated with the source row based on generating the output signal, and identifying a second column address of the third memory cell based on incrementing the column address counter.

Some examples of the method 800 and the apparatus described herein may further include operations, features, means, or instructions for determining that the management operation may be complete based on a third column address associated with the third memory cell.

In some examples of the method 800 and the apparatus described herein, determining that the management operation may be complete may include operations, features, means, or instructions for determining that the third column address satisfies a threshold associated with the source row.

Some examples of the method 800 and the apparatus described herein may further include operations, features, means, or instructions for precharging the target row based on determining the management operation may be complete.

In some examples of the method 800 and the apparatus described herein, initiating the management operation to transfer the information from the source row to the target row may include operations, features, means, or instructions for generating a write state signal and a global command address signal including an indication for a command address counter.

Figure 9:
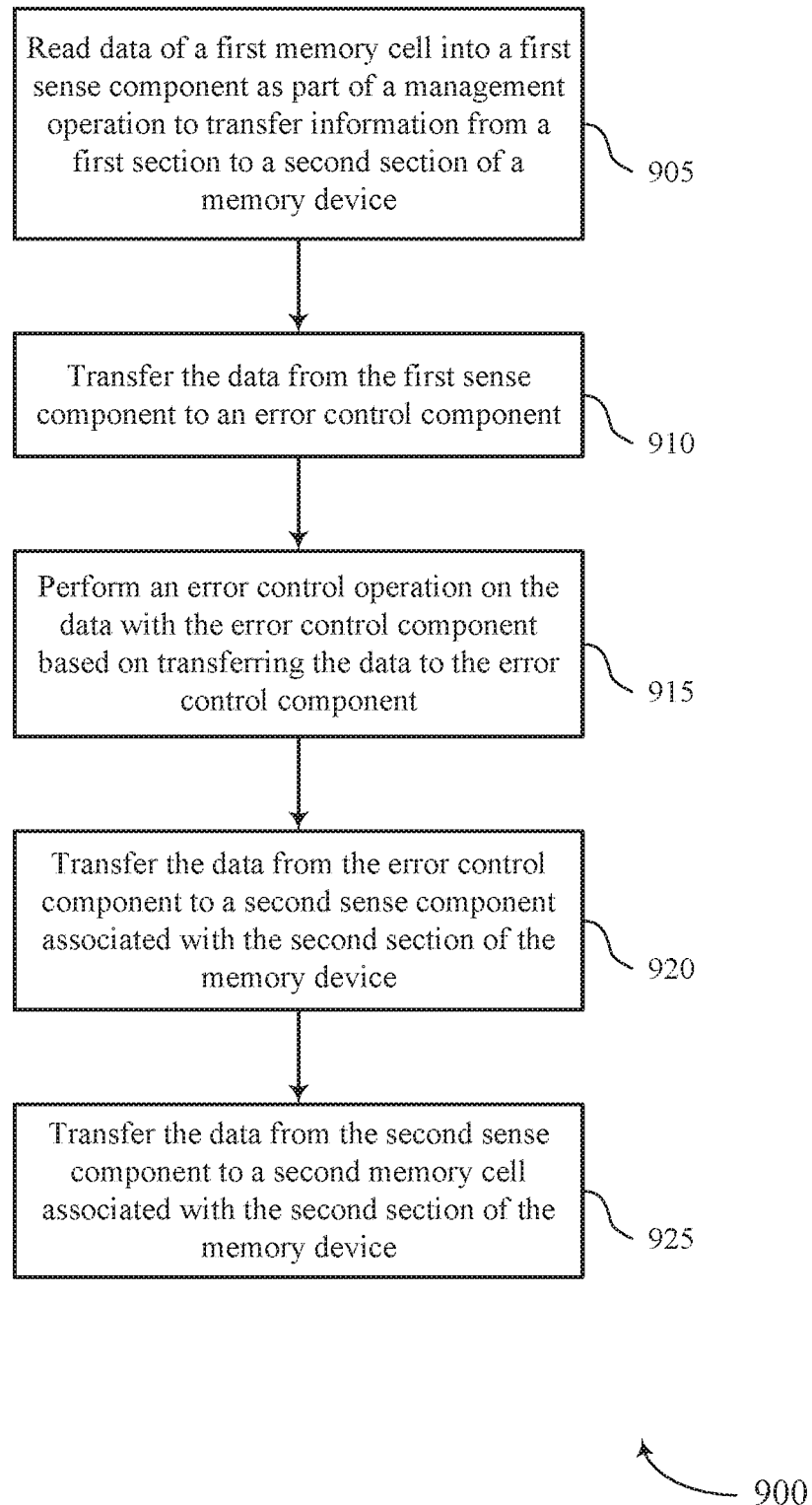

FIG. 9 shows a flowchart illustrating a method or methods 900 that supports error control for memory device in accordance with examples as disclosed herein. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may read data of a first memory cell into a first sense component as part of a management operation to transfer information from a first section to a second section of a memory device. The operations of 905 may be performed according to the methods described herein. In some examples, aspects of the operations of 905 may be performed by an operation manager as described with reference to FIG. 7.

At 910, the memory device may transfer the data from the first sense component to an error control component. The operations of 910 may be performed according to the methods described herein. In some examples, aspects of the operations of 910 may be performed by a sense component manager as described with reference to FIG. 7.

At 915, the memory device may perform an error control operation on the data with the error control component based on transferring the data to the error control component. The operations of 915 may be performed according to the methods described herein. In some examples, aspects of the operations of 915 may be performed by an error control component as described with reference to FIG. 7.

At 920, the memory device may transfer the data from the error control component to a second sense component associated with the second section of the memory device. The operations of 920 may be performed according to the methods described herein. In some examples, aspects of the operations of 920 may be performed by an error control component as described with reference to FIG. 7.

At 925, the memory device may transfer the data from the second sense component to a second memory cell associated with the second section of the memory device. The operations of 925 may be performed according to the methods described herein. In some examples, aspects of the operations of 925 may be performed by a sense component manager as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for reading data of a first memory cell into a first sense component as part of a management operation to transfer information from a first section to a second section of a memory device, transferring the data from the first sense component to an error control component, performing an error control operation on the data with the error control component based on transferring the data to the error control component, transferring the data from the error control component to a second sense component associated with the second section of the memory device, and transferring the data from the second sense component to a second memory cell associated with the second section of the memory device.

Some examples of the method 900 and the apparatus described herein may further include operations, features, means, or instructions for toggling, by the error control component, between the first sense component of the first section and the second sense component of the second section to transfer a set of data between the first sense component and the second sense component based on transferring the data to the second memory cell.

Some examples of the method 900 and the apparatus described herein may further include operations, features, means, or instructions for maintaining an activation of the first sense component after transferring the data from the first sense component to the error control component, where toggling between the first sense component of the first section and the second sense component of the second section may be based on maintaining the activation of the first sense component.

Some examples of the method 900 and the apparatus described herein may further include operations, features, means, or instructions for activating the first sense component of the first section, where reading the data may be based on activating the first sense component, and activating the second sense component of the second section based on performing the error control operation, where transferring the data from the error control component to the second sense component may be based on activating the second sense component.

In some examples of the method 900 and the apparatus described herein, the first section includes the first memory cell, and the second section includes the second memory cell. In some examples of the method 900 and the apparatus described herein, the first section includes the first sense component, and the second section includes the second sense component.

Some examples of the method 900 and the apparatus described herein may further include operations, features, means, or instructions for transferring the data from the first sense component to the error control component associated with the first section of the memory device, and transferring the data from the error control component to the second sense component associated with the second section of the memory device.

Some examples of the method 900 and the apparatus described herein may further include operations, features, means, or instructions for transferring the data from the first memory cell to the first sense component via a first digit line associated with the first section of the memory device, and transferring the data from the second sense component to the second memory cell via a second digit line associated with the second section of the memory device.

Some examples of the method 900 and the apparatus described herein may further include operations, features, means, or instructions for storing, in a first latch, a first section address associated with the first sense component, where transferring the data to the error control component from the first sense component may be based on storing the first section address in the first latch, and storing, in a second latch, a second section address associated with the second sense component, where transferring the data to the second sense component from the error control component may be based on storing the second section address in the second latch.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array including a first section and a second section, a control component associated with the memory array and configured to cause the apparatus to, perform an error control operation on data stored in a first memory cell coupled with the source row of the memory array based on initiating the management operation, the first memory cell located at a first column address and a first row address of the source row, write the data to a second memory cell coupled with the target row of the memory array based on performing the error control operation on the data, determine whether the management operation is complete based on the first column address of the first memory cell, and generate an output signal to perform the error control operation on a third memory cell coupled with the source row based on determining whether the management operation is complete.

Some examples may further include determining whether the first column address satisfies a threshold associated with the source row, where determining whether the management operation may be complete may be based on determining whether the first column address satisfies the threshold associated with the source row.

Some examples may further include combining one or more bits of the first column address into a value, and comparing the value with the threshold associated with the source row, where determining whether the first column address satisfies the threshold may be based on comparing the value with the threshold.

Some examples may further include reading the data of the first memory cell, determine an error in the data of the first memory cell, and correct the error based on determining the error, where performing the error control operation on the data stored in the first memory cell may be based on reading the data of the first memory cell, determining the error in the data of the first memory cell, and correcting the error.

An apparatus is described. The apparatus may include a memory array including a first section and a second section, a control component associated with the memory array and configured to cause the apparatus to, transfer the data from the first sense component to an error control component, perform an error control operation on the data with the error control component based on transferring the data to the error control component, transfer the data from the error control component to a second sense component associated with the second section of the memory device, and transfer the data from the second sense component to a second memory cell associated with the second section of the memory device.

Some examples may further include toggle, by the error control component, between the first sense component of the first section and the second sense component of the second section to transfer a set of data between the first sense component and the second sense component based on transferring the data to the second memory cell.

Some examples may further include maintaining an activation of the first sense component after transferring the data from the first sense component to the error control component, where toggling between the first sense component of the first section and the second sense component of the second section may be based on maintaining the activation of the first sense component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    initiating a management operation to transfer information from a source row to a target row of a memory device;
    performing an error control operation on data stored in a first memory cell coupled with the source row of the memory device based at least in part on initiating the management operation, the first memory cell located at a first column address and a first row address of the source row;
    writing the data to a second memory cell coupled with the target row of the memory device based at least in part on performing the error control operation on the data;
    determining whether the management operation is complete based at least in part on the first column address of the first memory cell;
    generating an output signal to perform the error control operation on a third memory cell coupled with the source row based at least in part on determining whether the management operation is complete;
    incrementing a column address counter associated with the source row based at least in part on generating the output signal; and
    identifying a second column address of the third memory cell based at least in part on incrementing the column address counter.

2. The method of claim 1, wherein determining whether the management operation is complete comprises:
    determining whether the first column address satisfies a threshold associated with the source row.

3. The method of claim 2, further comprising:
    combining one or more bits of the first column address into a value; and
    comparing the value with the threshold associated with the source row, wherein determining whether the first column address satisfies the threshold is based at least in part on comparing the value with the threshold.

4. The method of claim 1, wherein performing the error control operation on the data stored in the first memory cell comprises:
    reading the data of the first memory cell;
    determining an error in the data of the first memory cell; and
    correcting the error based at least in part on determining the error.

5. The method of claim 1, further comprising:
    determining that the management operation is complete based at least in part on a third column address associated with the third memory cell.

6. The method of claim 5, wherein determining that the management operation is complete comprises:
    determining that the third column address satisfies a threshold associated with the source row.

7. The method of claim 5, further comprising:
    precharging the target row based at least in part on determining the management operation is complete.

8. The method of claim 1, wherein initiating the management operation to transfer the information from the source row to the target row comprises:
    generating a write state signal and a global command address signal including an indication for a command address counter.

9. A method, comprising:
    initiating a management operation to transfer information from a source row to a target row of a memory device;
    performing an error control operation on data stored in a first memory cell coupled with the source row of the memory device based at least in part on initiating the management operation, the first memory cell located at a first column address and a first row address of the source row;
    writing the data to a second memory cell coupled with the target row of the memory device based at least in part on performing the error control operation on the data;
    combining one or more bits of the first column address into a value;
    comparing the value with a threshold associated with the source row;
    determining whether the management operation is complete based at least in part on the first column address of the first memory cell, wherein the determining comprises determining whether the first column address satisfies the threshold associated with the source row based at least in part on comparing the value with the threshold; and
    generating an output signal to perform the error control operation on a third memory cell coupled with the source row based at least in part on determining whether the management operation is complete.

10. The method of claim 9, wherein performing the error control operation on the data stored in the first memory cell comprises:
    reading the data of the first memory cell;
    determining an error in the data of the first memory cell; and
    correcting the error based at least in part on determining the error.

11. The method of claim 9, further comprising:
    incrementing a column address counter associated with the source row based at least in part on generating the output signal; and
    identifying a second column address of the third memory cell based at least in part on incrementing the column address counter.

12. The method of claim 9, further comprising:
    determining that the management operation is complete based at least in part on a third column address associated with the third memory cell.

13. The method of claim 12, wherein determining that the management operation is complete comprises:
    determining that the third column address satisfies the threshold associated with the source row.

14. The method of claim 12, further comprising:
    precharging the target row based at least in part on determining the management operation is complete.

15. The method of claim 9, wherein initiating the management operation to transfer the information from the source row to the target row comprises:
    generating a write state signal and a global command address signal including an indication for a command address counter.

16. A method, comprising:
    initiating a management operation to transfer information from a source row to a target row of a memory device, wherein the initiating comprises generating a write state signal and a global command address signal including an indication for a command address counter;
    performing an error control operation on data stored in a first memory cell coupled with the source row of the memory device based at least in part on initiating the management operation, the first memory cell located at a first column address and a first row address of the source row;

writing the data to a second memory cell coupled with the target row of the memory device based at least in part on performing the error control operation on the data;

determining whether the management operation is complete based at least in part on the first column address of the first memory cell; and generating an output signal to perform the error control operation on a third memory cell coupled with the source row based at least in part on determining whether the management operation is complete.

17. The method of claim 16, wherein determining whether the management operation is complete comprises:

combining one or more bits of the first column address into a value; and comparing the value with a threshold associated with the source row, wherein determining whether the management operation is complete comprises determining whether the first column address satisfies the threshold associated with the source row based at least in part on comparing the value with the threshold.

18. The method of claim 16, wherein performing the error control operation on the data stored in the first memory cell comprises:

reading the data of the first memory cell;

determining an error in the data of the first memory cell; and correcting the error based at least in part on determining the error.

19. The method of claim 16, further comprising:

incrementing a column address counter associated with the source row based at least in part on generating the output signal; and identifying a second column address of the third memory cell based at least in part on incrementing the column address counter.

20. The method of claim 16, further comprising:

determining that the management operation is complete based at least in part on a third column address associated with the third memory cell.

21. The method of claim 20, wherein determining that the management operation is complete comprises:

determining that the third column address satisfies a threshold associated with the source row.

22. The method of claim 20, further comprising:

precharging the target row based at least in part on determining the management operation is complete.

23. An apparatus, comprising:

a memory array comprising a first section and a second section; and a control component associated with the memory array and configured to cause the apparatus to:

initiate a management operation to transfer information from a source row to a target row of the memory array;

perform an error control operation on data stored in a first memory cell coupled with the source row of the memory array based at least in part on initiating the management operation, the first memory cell located at a first column address and a first row address of the source row;

write the data to a second memory cell coupled with the target row of the memory array based at least in part on performing the error control operation on the data;

determine whether the management operation is complete based at least in part on the first column address of the first memory cell;

generate an output signal to perform the error control operation on a third memory cell coupled with the source row based at least in part on determining whether the management operation is complete;

increment a column address counter associated with the source row based at least in part on generating the output signal; and identify a second column address of the third memory cell based at least in part on incrementing the column address counter.

24. The apparatus of claim 23, wherein the control component is further configured to cause the apparatus to:

determine whether the first column address satisfies a threshold associated with the source row, wherein determining whether the management operation is complete is based at least in part on determining whether the first column address satisfies the threshold associated with the source row.

25. The apparatus of claim 24, wherein the control component associated with the memory array is further configured to cause the apparatus to:

combine one or more bits of the first column address into a value; and compare the value with the threshold associated with the source row, wherein determining whether the first column address satisfies the threshold is based at least in part on comparing the value with the threshold.

26. The apparatus of claim 23, wherein the control component is further configured to cause the apparatus to:

read the data of the first memory cell;

determine an error in the data of the first memory cell; and correct the error based at least in part on determining the error, wherein performing the error control operation on the data stored in the first memory cell is based at least in part on reading the data of the first memory cell, determining the error in the data of the first memory cell, and correcting the error.

* * * * *